(12) United States Patent
Choi

(10) Patent No.: US 7,755,262 B2
(45) Date of Patent: Jul. 13, 2010

(54) ORGANIC EL DISPLAY

(75) Inventor: Hong Seok Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 273 days.

(21) Appl. No.: 11/129,445

(22) Filed: May 16, 2005

(65) Prior Publication Data

US 2005/0253494 A1 Nov. 17, 2005

(30) Foreign Application Priority Data

May 17, 2004 (KR) .................. 10-2004-0034857
Sep. 6, 2004 (KR) .................. 10-2004-0070852

(51) Int. Cl.
*H05B 33/05* (2006.01)

(52) U.S. Cl. .................. 313/112; 313/113; 313/504; 313/506

(58) Field of Classification Search ......... 313/112–113, 313/310–311, 498–512
See application file for complete search history.

(56) References Cited

U.S. PATENT DOCUMENTS

| | | | |
|---|---|---|---|
| 4,097,130 A * | 6/1978 | Cole, Jr. ................ | 349/79 |
| 6,549,335 B1 * | 4/2003 | Trapani et al. ......... | 359/490 |
| 6,649,284 B2 * | 11/2003 | Wang et al. ............ | 428/690 |
| 6,995,816 B2 * | 2/2006 | Mi et al. ................ | 349/96 |
| 2002/0167630 A1 * | 11/2002 | Fujieda et al. ......... | 349/117 |
| 2003/0193635 A1 | 10/2003 | Mi | |
| 2004/0012328 A1 * | 1/2004 | Arnold et al. .......... | 313/504 |
| 2006/0098137 A1 | 5/2006 | Kameyama et al. ..... | 349/96 |

FOREIGN PATENT DOCUMENTS

| | | |
|---|---|---|
| EP | 1 074 875 A1 | 2/2001 |
| JP | 09-127885 | 5/1997 |
| JP | 2001-195003 | 7/2001 |
| JP | 2001-195003 A | 7/2001 |
| KR | 10-2002-0033572 | 5/2002 |
| WO | WO 02/10845 A2 | 2/2002 |
| WO | WO 02/077679 A1 | 10/2002 |
| WO | WO 2004/019086 A1 | 3/2004 |
| WO | WO 2004/036272 A1 | 4/2004 |

OTHER PUBLICATIONS

European Office Action dated Apr. 4, 2007.

* cited by examiner

*Primary Examiner*—Nimeshkumar D. Patel
*Assistant Examiner*—Anne M Hines
(74) *Attorney, Agent, or Firm*—Morgan, Lewis & Bockius LLP

(57) ABSTRACT

An organic EL display having a polarizing plate is disclosed. The present invention includes an organic EL display panel, a first polarizing plate on the panel to convert a circularly or linearly polarized light to a linearly or circularly polarized light, and a second polarizing plate on the first polarizing plate to have a polarization characteristic of absorbing light in a high light efficiency wavelength range more than light in a low light efficiency wavelength range.

9 Claims, 4 Drawing Sheets

ORGANIC EL DISPLAY

This application claims the benefit of the Korean Patent Application No. 10-2004-0034857, filed on May 17, 2004, and the Korean Patent Application No. 10-2004-0070852, filed on Sep. 6, 2004, which is hereby incorporated by reference as if fully set forth herein.

BACKGROUND OF THE INVENTION

1. Field of the Invention

The present invention relates to an organic EL display, and more particularly, to an organic EL display having a polarizing plate.

2. Discussion of the Related Art

Generally, current drive type flat panel displays including LCD (liquid crystal display), PDP (plasma display panel), VFD (visual fluorescent display), FED (field emission display), LED (light emitting diode), EL (electroluminescence) and the like has been display developed to surpass CRT (cathode ray tube) has been used most popularly for decades.

The current drive type display devices have the high visibility and good color sense and their fabricating processes are simple. So, the current drive type display devices are expanding their application fields.

And, an organic EL display attracts public attention as a flat panel display occupying less space despite the size enlargement of a display device.

In the organic EL display, data lines cross with scan lines to configure a matrix, an emitting layer is formed on a pixel provided to each intersection between the data and scan lines, and a light-emitting state depends on voltages applied to the data and scan lines.

However, a contrast ratio between light and shade in a conventional organic EL display is lowered since an external light such as outdoor sunlight, indoor illumination and the like transmits the organic EL display to be reflected on a cathode of the organic EL display.

Moreover, although the conventional organic EL display uses various polarizing plates to prevent the degradation of the contrast ratio, light efficiency is lowered since light emitted from the organic EL display passes through the polarizing plate to be absorbed in part.

SUMMARY OF THE INVENTION

Accordingly, the present invention is directed to an organic EL display that substantially obviates one or more problems due to limitations and disadvantages of the related art.

An object of the present invention is to provide an organic EL display, in which transmittance of light at a wavelength range having low light efficiency is raised, in which polarization efficiency is lowered, by which light-emitting efficiency of the organic EL display is enhanced, and by which degradation of a contrast ration due to an external light reflection can be prevented.

Another object of the present invention is to an organic EL display, by which light-emitting efficiency enhancement and power consumption reduction can be achieved in a manner of differentiating transmittance or polarization efficiency per a specific wavelength range.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic EL display according to the present invention includes an organic EL display panel a first polarizing plate on the panel to convert a circularly or linearly polarized light to a linearly or circularly polarized light, and a second polarizing plate on the first polarizing plate to have a polarization characteristic of absorbing light in a high light efficiency wavelength range more than light in a low light efficiency wavelength range.

Preferably, the first polarizing plate is a $\lambda/4$ retarder. And, the second polarizing plate is a dichroic dye based polarizing plate fabricated by aligning dichroic dye in one direction by extension wherein the dichroic dye has a light absorption characteristic differing according to a light wavelength and a polarized direction.

Preferably, a maximum value of polarization efficiency of the second polarizing plate is tuned to a wavelength corresponding to a maximum value of a visual curve.

Preferably, a maximum value of polarization efficiency of the second polarizing plate is tuned to a wavelength corresponding to a maximum value of an external light.

Preferably, polarization efficiency and transmittance of the second polarizing plate are differently set per a red, green or blue wavelength.

Preferably, the second polarizing plate raises transmittance in ranges of red an blue wavelengths and the second polarizing plate lowers polarization efficiency in the ranges of the red and blue wavelengths.

Preferably, n the second polarizing plate raises transmittance in a range of a blue wavelength and the second polarizing plate lowers polarization efficiency in the range of the blue wavelength.

In another aspect of the present invention, an organic EL display includes a substrate, an anode on one surface of the substrate, an organic EL layer on the anode, a cathode on the organic EL layer, a $\lambda/4$ retarder on the other surface of the substrate to convert a circularly or linearly polarized light to a linearly or circularly polarized light, and a dichroic dye based polarizing plate on the $\lambda/4$ retarder to have a polarization characteristic of absorbing light in a high light efficiency wavelength range more than light in a low light efficiency wavelength range.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Whenever possible, the same reference numbers will be used throughout the drawings to refer to the same or like parts.

Figure 1:
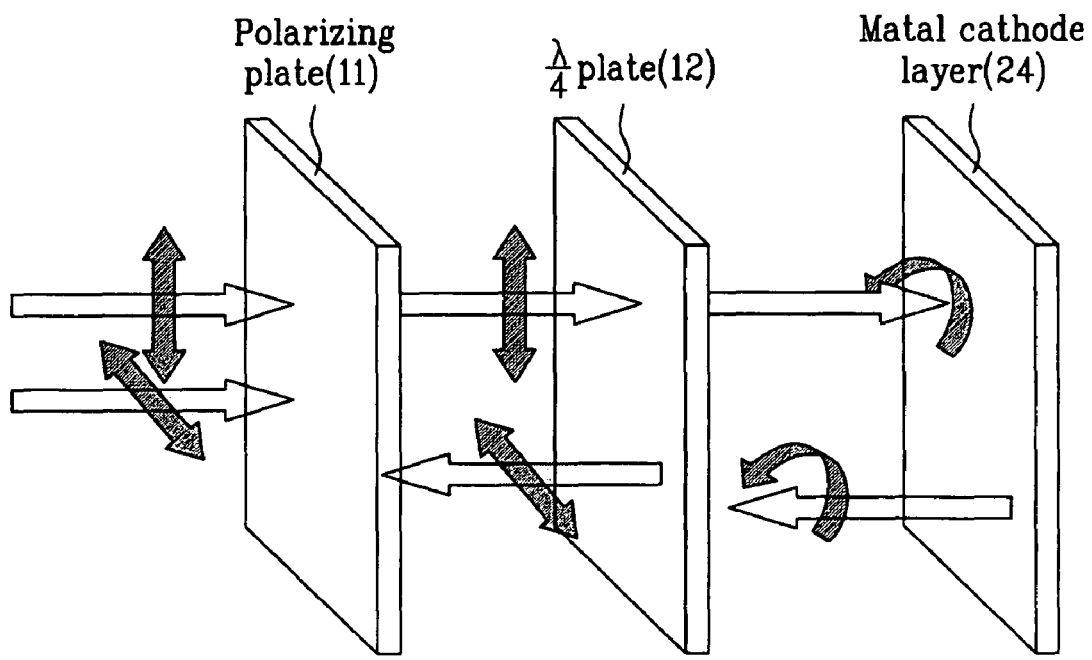
FIG. 1 is a diagram for explaining a polarization principle of an organic EL display according to the present invention.
Figure 2:
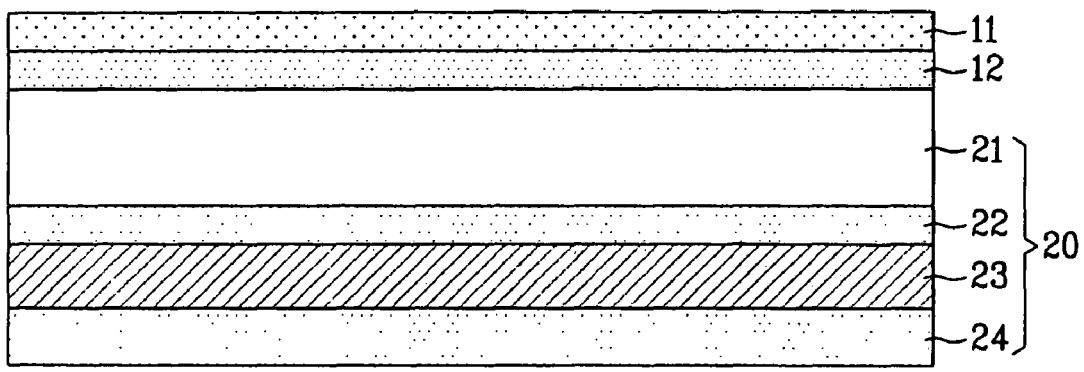
FIG. 2 is a cross-sectional diagram of an organic EL display according to the present invention.

FIG. 1 is a diagram for explaining a polarization principle of an organic EL display according to the present invention and FIG. 2 is a cross-sectional diagram or an organic EL display according to the present invention.

Referring to FIG. 1 and FIG. 2, in an organic EL display according to the present invention, an organic EL display panel 20 includes a substrate 21, an anode 22 on one surface of the substrate 21, an organic EL layer 23 on the anode 22, a cathode 24 on the organic EL layer 23, a first polarizing plate 12 on the other surface of the substrate 21, and a second polarizing plate 11 on the first polarizing plate 12. In this case, the first polarizing plate 12 may include a λ/4 retarder that converts a circularly polarized light to a linearly polarized light or a linearly polarized light to a circularly polarized light.

The second polarizing plate 11 has a polarizing characteristic of absorbing light at a wavelength range having high light efficiency higher more than light at a wavelength range having low light efficiency. In this case, the second polarizing plate 11 may include a dichroic dye based polarizing plate formed by aligning a dichroic dye, which has a different light absorbing characteristic according to light wavelength and polarized direction, in one direction.

A maximum value of polarization efficiency of the second polarizing plate 11 is preferably set to a wavelength corresponding to a maximum value of a visual curve or a wavelength corresponding to a maximum value of an external light. In this case, polarization efficiency and transmittance rate of the second polarizing plate 11 are set differently according to red, green and blue wavelengths.

Namely, in the first embodiment of the present invention, the second polarizing plate 11 is set to raise the transmittance rate and to lower the polarization efficiency in the areas of the red and blue wavelengths. In the second embodiment of the present invention, the second polarizing plate 11 is set to raise the transmittance rate and to lower the polarization efficiency in the area of the blue wavelength.

Generally, a polarizing plate can exhibit its characteristics using transmittance rates Tx and Ty for the light polarized with respect to two directions, x-axis and y-axis vertical to each other. Namely, transmittance rate $T_0$ for non-polarized light can be expressed by Equation 1.

$$\text{Transmittance}(T_0) = (Tx+Ty)/2 \qquad \text{[Equation 1]}$$

And, a transmittance rate (Tcr) in aligning the same polarizing plates vertically opposing each other can be expressed by Equation 2.

$$\begin{aligned}\text{Transmittance}(Tcr) &= 0.5*Tx*Ty + 0.5*Ty*Tx \\ &= Tx*Ty\end{aligned} \qquad \text{[Equation 2]}$$

And, polarization efficiency (P) can be expressed by Equation 3.

$$\text{Polarization efficiency}(P) = |Tx-Ty|/(Tx+Ty) \qquad \text{[Equation 3]}$$

In this case, in case of an iodine based polarizing plate, Tx=0.84 and Ty=0. If these values are applied to Equation 1 to Equation 3, $T_0$=0.42, Tcr=0 and P=1.

In aspect of an external light cut-off effect of circular polarization using the above equations, circular polarization (e.g., left-handed circular polarization) is carried out in a following manner. First of all, a linearly polarized light of 50% of an entire external light 10 with respect to an x-axis is passed through the polarizing plate 11 and then passes through the λ/4 retarder that is the first polarizing plate 12.

If the left-handed circularly polarized light is reflected on the metal cathode 24 having reflectivity R, it becomes a right-handed circularly polarized light. If the right-handed circularly polarized light passes through the λ/4 retarder that is the first polarizing plate 12, it is converted to a linearly polarized light with respect to a y-axis direction. Hence, the external light passing through the second polarizing plate 11 becomes 0.5 $I_0$TxTyR. In this case, by considering the rest 50% of the y-axis linearly polarized light, the entire external light reflection becomes $I_0$TxTyR.

Namely, if a polarization axis of the second polarizing plate 11 and an extension axis of the λ/4 retarder that is the first polarizing plate 12 having anisotropy of reflectivity due to an extension of a film are mutually arranged by about 45°, the external light, which passed through the second polarizing plate 11 to be linearly polarized in the x-axis direction, passes through the λ/4 retarder that is the first polarizing plate 12 to be circularly polarized (e.g., left-handed circular polarization). If this light is reflected on the cathode 24, becomes a right-handed circularly polarized light.

If the circularly polarized light passes through the λ/4 retarder that is the first polarizing plate 12, it is converted to a linearly polarized light in the y-axis direction opposite to that of the former polarized light. And, the converted light is entirely absorbed in the second polarizing plate 11. Hence, as the external light is entirely absorbed by the circular polarization, the organic EL display panel can implement high contrast ratio.

Meanwhile, in case of a general optical filer (ND filter) having the same transmittance {$T_0$=(Tx+Ty)/2} of the circular polarization, external light reflection becomes $I_0T_0$2R. In this case, if data (Tx=0.84, Ty=0) of the commercialized iodine based polarizing plate are used, the external light reflection of the circular polarization becomes 0. And, in case of the optical filter, it becomes 0.176 $I_0$R.

Through the above result, it can be confirmed that the organic EL display panel has a considerable external light reflection inhibition effect of the circular polarization. This is because polarization information can be sustained in reflection due to the mirror-like clean metal electrode of the organic EL display panel.

Meanwhile, to mitigate luminance reduction due to low transmittance of the polarizing plate, polarization efficiency of the polarizing plate can be lowered but transmittance of the polarizing plate can be raised. Namely, comparison of the ND filter having the same transmittance of circular polarization can be expressed by Equation 4.

$$TxTy \leq [(Tx+Ty)/2]^2, \text{ where equalized if } Tx=Ty.$$ [Equation 4]

In Equation 4, it can be confirmed that the external light cut-off effect of the circular polarization is higher. For instance, if Tx=0.9 and Ty=0.1, $\{(Tx+Ty)/2\}^2=0.25$. Hence, it can be confirmed that the circular polarization has about 2.8 times external light cut-off effect.

The present invention is characterized in implementing high light efficiency and contrast ratio using the dichroic dye based polarizing plate as the second polarizing plate 11 and the λ/4 retarder as the first polarizing plate 12.

A maximum value of the polarization efficiency of the dichroic dye used for the second polarizing plate 11 of the present invention is set to coincide with a wavelength corresponding to a maximum value of the visual curve or the external light. And, the second polarizing plate 11 of the present invention is set to ultimately maximize an input power to light efficiency as a quantity of current flowing in each RGB subpixel becomes similar by differentiating transmittance or polarization efficiency per rod, green and blue wavelength.

The dichroic dye based polarizing plate, which is the second polarizing plate 11, is fabricated by aligning a dichroic dye, which has a different light absorption characteristic according to a polarized direction due to molecular configuration, in one direction by instrumental extension. In this case, to implement the polarization characteristics in the entire visible ray range, at least two kinds of dyes differing in absorption area are appropriately selected.

Figure 3A:
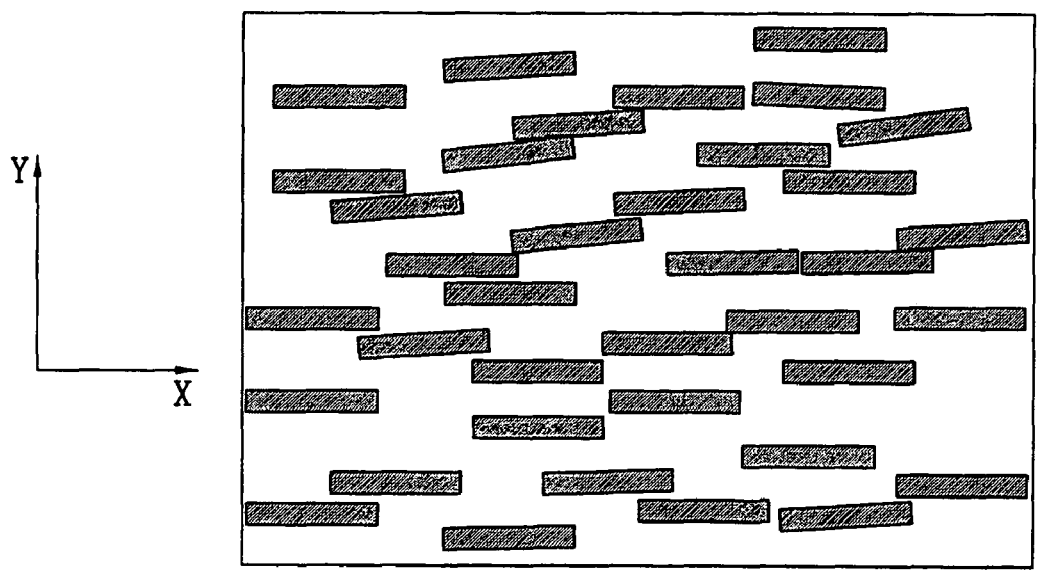
FIG. 3A is a diagram of dichroic dye aligned by extension.
Figure 3B:
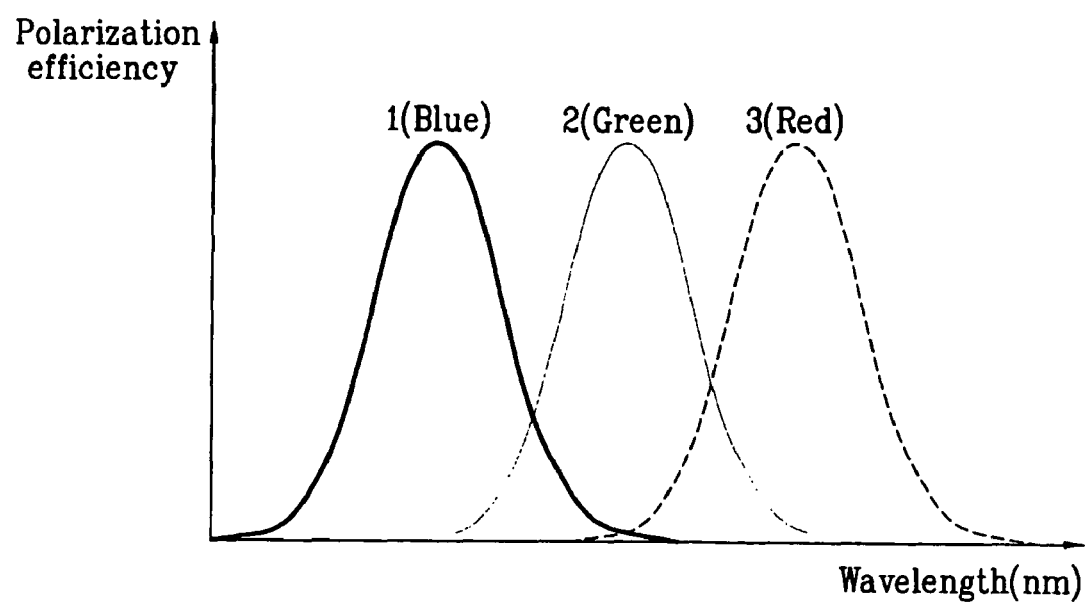
FIG. 3B is a graph of an absorption spectrum by dyes.
Figure 4:
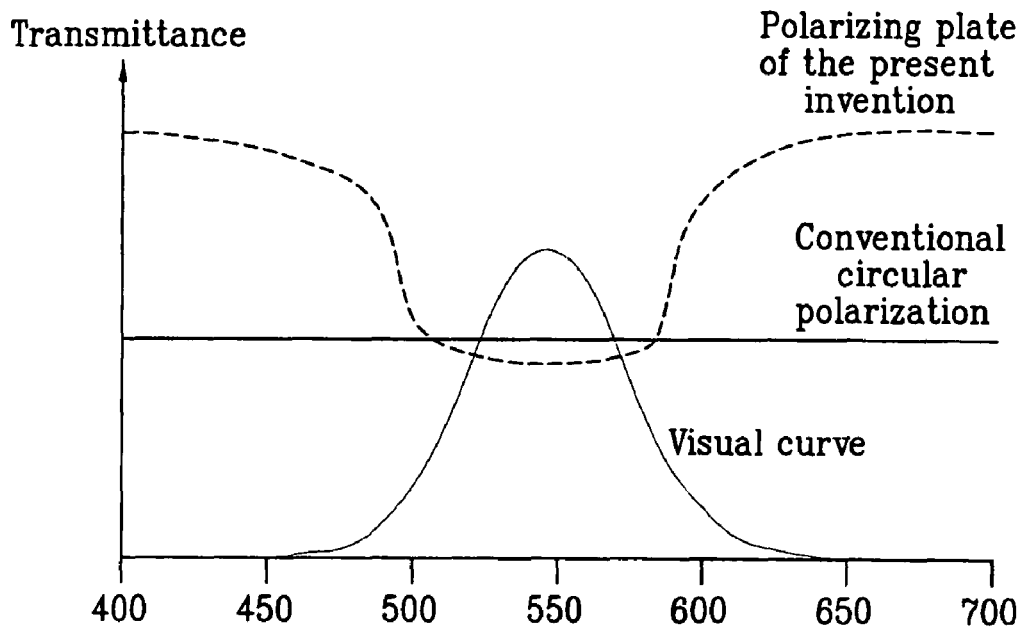
FIG. 4 is a graph of a transmittance comparison between a polarizing plate of an organic EL display according to a first embodiment of the present invention and a polarizing plate of a conventional organic EL display.
Figure 5:
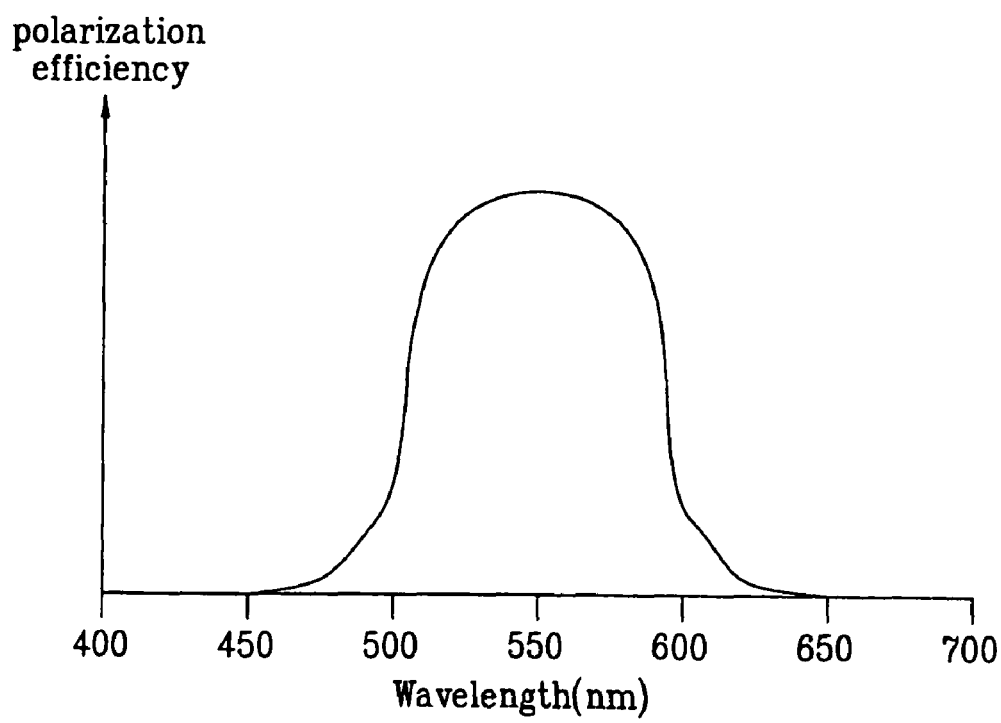
FIG. 5 is a graph of a polarization efficiency comparison between a polarizing plate of an organic EL display according to a first embodiment of the present invention and a polarizing plate of a conventional organic EL display.

FIG. 3A is a diagram of dichroic dye aligned by extension, FIG. 3B is a graph of an absorption spectrum by dyes, FIG. 4 is a graph of a transmittance comparison between a polarizing plate of an organic EL display according to a first embodiment of the present invention and a polarizing plate of a conventional organic EL display, and FIG. 5 is a graph of a polarization efficiency comparison between a polarizing plate of an organic EL display according to a first embodiment of the present invention and a polarizing plate of a conventional organic EL display.

Referring to FIG. 4, a polarizing plate of the present invention is designed to maximize absorption of dye in about 500~600 nm wavelength range by taking about 550 nm wavelength as a reference to consider a visual curve according to a human eye responding to light.

Referring to FIG. 5, polarization characteristics of the polarizing plate of the present invention is designed to be maximized in about 500~600 nm wavelength range by taking about 550 nm wavelength as a reference. On the other hand, the polarizing plate of the present invention is designed to raise transmittance and to lower polarization characteristics in blue or red area except the about 500~600 nm wavelength range.

Namely, the present invention lowers the polarization characteristic of the polarizing plate in the blue or red area more or less to raise the light transmittance.

The present invention prepares a circularly polarizing plate using the λ/4 retarder as the first polarizing plate 12 together with the above-designed dichroic dye based polarizing plate as the second polarizing plate 11, thereby enhancing the external light influence and the light efficiency.

Namely, in aspect of the external light reflection, the luminance of the external light reflection affecting the contrast ratio accurately corresponds to a format multiplied by a visual curve y(λ) having the maximum value at 550 nm like Equation 5.

Hence, the polarizing plate of the present invention that raises the polarization characteristic of the corresponding part is superior to the polarizing plate raising the transmittance overall or the optical filter having the same transmittance in the external light cut-off function.

$$L(\text{external light reflection luminance}) = \int_{680}^{780} I_0(\lambda)T_x(\lambda)T_y(\lambda)R(\lambda)y(\lambda)d\lambda$$ [Equation 5]

In viewpoint of light efficiency, in case of green, the transmittance of the polarizing plate of the present invention is equal to that of the conventional polarizing plate. Yet, the transmittance of blue or red becomes higher than that of the conventional polarizing plate. Hence, power consumption for implementing the same brightness can be considerably lowered.

Namely, in Table 1 for the comparison of current ratios in red, green and blue of the organic EL display panel, in case of green having good emitting efficiency using the conventional circular polarization, a current consumption quantity is small. Yet, in case of red having poor emitting efficiency, current flows three times greater than that of green.

Thus, the big difference of current flowing through the emitting pixels accelerates degradation of a specific color in aspect of device endurance and puts limitation on a drive for gray scale representation,

TABLE 1

| mA | Red | Green | Blue | Total |
|---|---|---|---|---|
| Conventional circular polarization | 15 | 5 | 8 | 28 |
| Polarizing plate of the present invention | 8 | 6 | 7 | 21 |

On the other band, in case of using the polarizing plate of the present invention, current supply may be raised since transmittance of green is lower than that of the conventional circular polarization according to the case shown in Table 1. Yet, in case of red, a current quantity can be lowered due to the improvement of transmittance so that overall power consumption for the same luminance can be considerably reduced.

Thus, the relative reduction of the transmittance in the 500~600 band in the present invention reduces the light emission of tail portions of the red and blue spectra to be advantageous in moving color coordinates closer to NTSC coordinates. So, it is able to consider the color coordinates variation in designing dyes using the above advantages.

Figure 6:
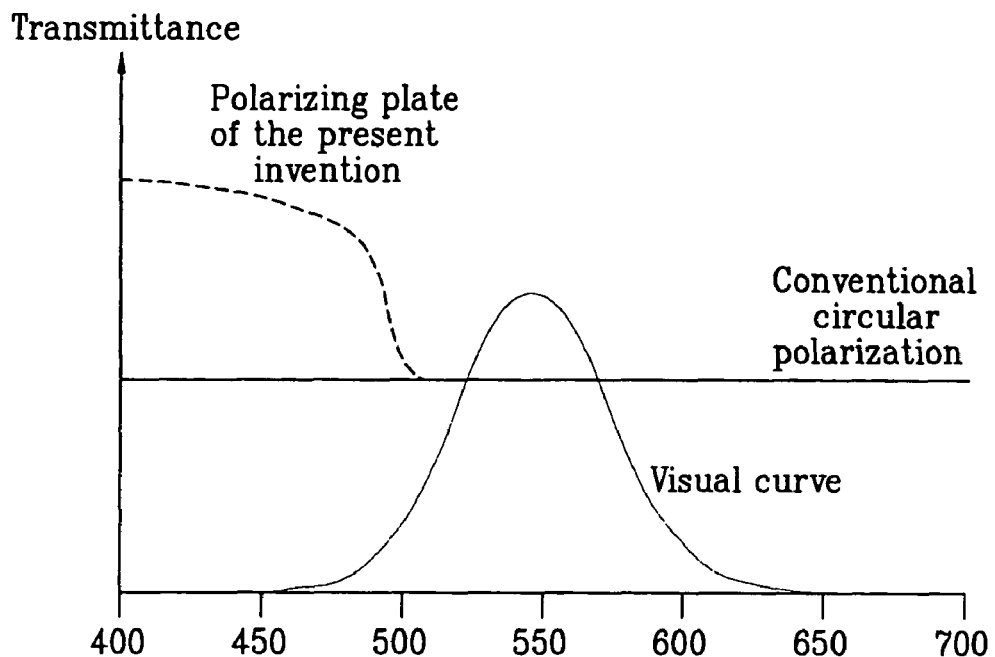
FIG. 6 is a graph of a transmittance comparison between a polarizing plate of an organic EL display according to a second embodiment of the present invention and a polarizing plate of a conventional organic EL display.
Figure 7:
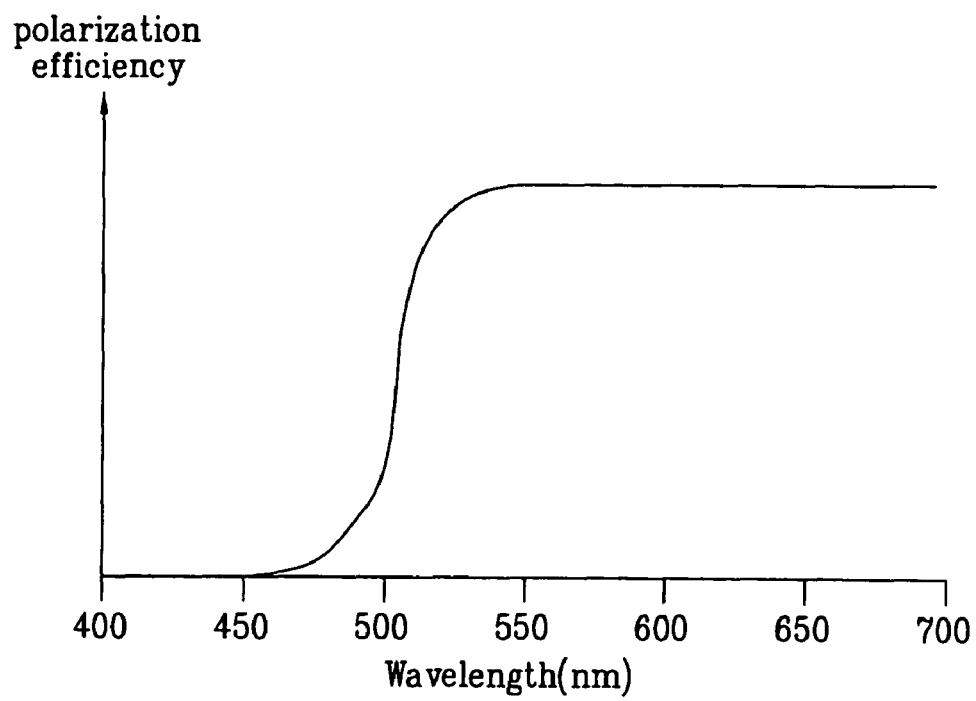
FIG. 7 is a graph of a polarization efficiency comparison between a polarizing plate of an organic EL display according to a second embodiment of the present invention and a polarizing plate of a conventional organic EL display.

FIG. 6 is a graph of a transmittance comparison between a polarizing plate of an organic EL display according to a second embodiment of the present invention and a polarizing plate of a conventional organic EL display and FIG. 7 is a graph of a polarization efficiency comparison between a polarizing plate of an organic EL display according to a second embodiment of the present invention and a polarizing plate of a conventional organic EL display.

In the second embodiment of the present invention, the enhancement of the emitting characteristics of an organic EL display and the current remarkable improvement of emitting efficiency due to the developments of phosphorescent devices are taken into consideration.

Generally, considering the current development status of the phosphorescent devices, mass production of red and green phosphorescent devices is enabled but the blue phosphorescent device is under development.

Hence, in the second embodiment, as shown in FIG. 6, of the present invention, polarization characteristics in the green and red wavelength ranges over about 500 nm are maximized using the polarizing plate fabricated using at least one dichroic dye and transmittance of light in a blue wavelength range is raised by lowering the polarization characteristics in the blue wavelength range.

In viewpoint of light efficiency, the green or red has the same transmittance of the conventional polarizing plate. Yet, the transmittance of the blue having the relatively low light efficiency becomes higher than that of the conventional polarizing plate to enable the reduction of power consumption for the implementation of the same brightness.

Namely, if current ratios flowing in the red, green and blue of the organic EL display having a high-efficiency phosphorescent or fluorescent material applied to the red and green are compared like Table 2, a current consumption quantity is small in case of the green having good emitting efficiency. Yet, current 1.5 times greater than that of the green flows in case of the blue having poor emitting efficiency.

Thus, the big difference of current flowing through the emitting pixels accelerates degradation of a specific color in aspect of device endurance and puts limitation on a drive for gray scale representation.

TABLE 2

| mA | Red | Green | Blue | Total |
|---|---|---|---|---|
| Conventional circular polarization | 5 | 5 | 8 | 18 |
| Polarizing plate of the present invention | 5 | 5 | 5.5 | 16 |

Thus, since the light transmittance of about 500 nm band increases in the second embodiment of the present invention, relative light emission of a tail portion of a long wavelength side of the blue spectrum is lowered to be advantageous in moving the color coordinates closer to the NTSC coordinates. So, it is able to consider the color coordinates variation in designing the polarizing plate using the above advantages. And, the dichroic dye based polarizing plate is applicable to a mono display emitting blue only as well as a color organic EL display. In this case, luminance increase or power consumption reduction can be implemented as well.

Meanwhile, the terminologies used in the description of the present invention are defined to take the functions in the present invention into consideration and may vary according to intentions or conventions of those skilled in the art. Hence, the definitions of the terminologies should be made based on the overall contents of the present invention.

Moreover, the present invention has been described through the preferred embodiment of the present invention, another embodiment of the present invention can be differently modified by those skilled in the art. Hence, it is apparent that the embodiment and modification citing the above-explained technical background belong to the claims of the present invention.

Accordingly, the present invention provides the following effects or advantages.

First of all, by fabricating the dichroic dye based polarizing plate in a manner of aligning dichroic dyes having different light absorption characteristics according to polarized directions in one direction and by using the dichroic dye based polarizing plate and the $\lambda/4$ retarder, the organic EL display according to the present invention can simultaneously implement high light efficiency and contrast ratio. By preventing current from being concentrated on one species of pixel, the present invention can elongate the endurance of the organic EL display. Secondly, the present invention facilitates gray scale representation and improves the color purity and color coordinates of red, green and blue trough dye design.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic EL display comprising:
   an organic EL display panel to have a metal electrode;
   a first polarizing plate on the organic EL display panel; and
   a second polarizing plate on the first polarizing plate to have a polarization characteristic of absorbing light in a high light efficiency wavelength range more than light in a low light efficiency wavelength range,
   wherein the first polarizing plate is converting a linearly polarized light into a circularly polarized or converting a circularly polarized light into a linearly polarized light and
   wherein polarization efficiency and transmittance of the second polarizing plate are differently set per a red wavelength, a green wavelength and a blue wavelength, respectively and the second polarizing plate has high transmittance and low polarization efficiency in a blue wavelength rather than the green and red wavelengths.

2. The organic EL display of claim 1, wherein the first polarizing plate is a $\lambda/4$ retarder.

3. The organic EL display of claim 1, wherein the second polarizing plate is a dichroic dye based polarizing plate fabricated by aligning dichroic dye in one direction by extension wherein the dichroic dye has a light absorption characteristic differing according to a light wavelength and a polarized direction.

4. The organic EL display of claim 1, wherein a maximum value of polarization efficiency of the second polarizing plate is tuned to a wavelength corresponding to a maximum value of a visual curve.

5. The organic EL display of claim 1, wherein a maximum value of polarization efficiency of the second polarizing plate is tuned to a wavelength corresponding to a maximum value of an external light.

6. An organic EL display comprising:
   a substrate;
   an anode on one surface of the substrate;
   an organic EL layer on the anode;
   a metal cathode on the organic EL layer;
   a $\lambda/4$ retarder on the other surface of the substrate; and
   a dichroic dye based polarizing plate on the $\lambda/4$ retarder to have a polarization characteristic of absorbing light in a high light efficiency wavelength range more than light in a low light efficiency wavelength range, wherein the dichroic dye based polarizing plate is fabricated by aligning dichroic dye in one direction by extension,
   wherein the $\lambda/4$ retarder is converting a linearly polarized light from the dichroic dye based polarizing plate into a circularly polarized light to the substrate and converting a circularly polarized light from the substrate into a linearly polarized light to the dichroic dye based polarizing plate and wherein the dichroic dye based polarizing plate has high transmittance and low polarization efficiency in a blue wavelength rather than the red and green wavelengths.

7. The organic EL display of claim 6, wherein the dichroic dye has a light absorption characteristic differing according to a light wavelength and a polarized direction.

8. The organic EL display of claim 6, wherein a maximum value of polarization efficiency of the dichroic dye based polarizing plate is tuned to a wavelength corresponding to a maximum value of a visual curve.

9. An organic EL display comprising:

an organic EL display panel to have a metal electrode;

a first polarizing plate on the organic EL display panel; and a second polarizing plate on the first polarizing plate to have a polarization characteristic of absorbing light in a high light efficiency wavelength range more than light in a low light efficiency wavelength range, wherein the first polarizing plate is converting a linearly polarized light into a circularly polarized or converting a circularly polarized light into a linearly polarized light and wherein the second polarizing plate has high transmittance and low polarization efficiency in blue and red wavelengths rather than a green wavelength.

* * * * *